Figure 1:
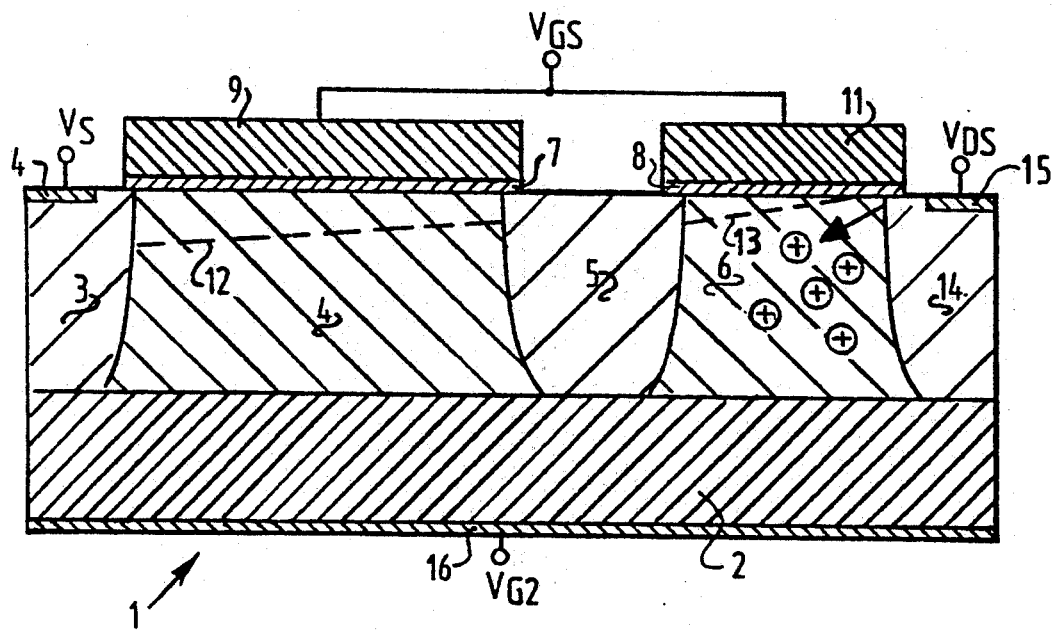

United States Patent [19]
Colinge et al.

[11] Patent Number: 5,272,369
[45] Date of Patent: Dec. 21, 1993

[54] CIRCUIT ELEMENT WITH ELIMINATION OF KINK EFFECT

[75] Inventors: Jean P. Colinge, Louvain-la-Neuve, Belgium; Ming H. Gao, Shanghai, China

[73] Assignee: Interuniversitair Micro-Elektronica Centrum vzw, Leuven-Heverlee, Belgium

[21] Appl. No.: 891,672

[22] Filed: May 29, 1992

Related U.S. Application Data

[63] Continuation of Ser. No. 674,861, Mar. 25, 1991, abandoned.

[30] Foreign Application Priority Data

Mar. 28, 1990 [NL] Netherlands .................. 9000736

[51] Int. Cl.⁵ .................... H01L 29/78; H01L 27/01
[52] U.S. Cl. .................... 257/352; 257/365
[58] Field of Search .................. 357/23.7, 23.14; 257/365, 349, 352, 353

[56] References Cited

U.S. PATENT DOCUMENTS

| | | | |
|---|---|---|---|
| 3,328,601 | 6/1967 | Rosenbaum | 357/23.14 |
| 3,427,514 | 2/1969 | Olmstead et al. | 357/23.14 |
| 3,436,622 | 4/1969 | Warner | 357/23.14 |
| 3,658,586 | 4/1969 | Wang | 357/51 |
| 3,872,491 | 3/1975 | Hanson et al. | 357/23 |
| 4,635,088 | 1/1987 | Eguchi | 357/41 |
| 4,748,485 | 5/1988 | Vasudev | 357/23.7 |

FOREIGN PATENT DOCUMENTS 58-87875  5/1983  Japan ................ 357/23.14

*Primary Examiner*—Jerome Jackson
*Assistant Examiner*—D. Monin
*Attorney, Agent, or Firm*—Limbach & Limbach

[57] ABSTRACT

A circuit element which includes a source region of a first conductance type provided with a source terminal, an intermediate region of the first conductance type separated from the source region by a first volume, a first channel region portion of a second conductance type provided with a first gate terminal and occupying the first volume, a drain region of the first conductance type provided with a drain terminal and separated from the intermediate region by a second volume, a second channel region portion of the second conductance type provided with a second gate terminal conductively connected to the first gate terminal and occupying said second volume, and an oxide layer. The first channel region portion, the intermediate region, and the second channel region portion are deposited on one face of the oxide layer. The design of the circuit element reduces adverse consequences of the so-called Kink effect, to which other circuit elements have been subject.

6 Claims, 2 Drawing Sheets

CIRCUIT ELEMENT WITH ELIMINATION OF KINK EFFECT

This is a continuation of co-pending application Ser. No. 07/674,861 filed on Mar. 25, 1991, now abandoned.

The so-called Kink effect occurs in MOSFETs at the temperature of liquid helium (4.2 K) and also at higher temperatures in the case of SOI (Silicon on Insulator) nMOSFETs. The Kink effect is thought to occur at the saturation current $I_{Dsat}$ when charge carriers with a polarity opposite that of the channel are generated in the channel by ionization in the pinch-off region at the drain. When the thus generated charge carriers (holes at a nMOS channel) cannot escape due to the low temperature in the substrate or the back oxide, the effective channel resistance $R_L$ is reduced.

Thin-film SOI-MOS elements display no Kink effect but are not suitable for applications where radiation occurs, such as in space travel.

A circuit element as according to claim 1 suffers no adverse consequences from the Kink effect.

Figure 2:
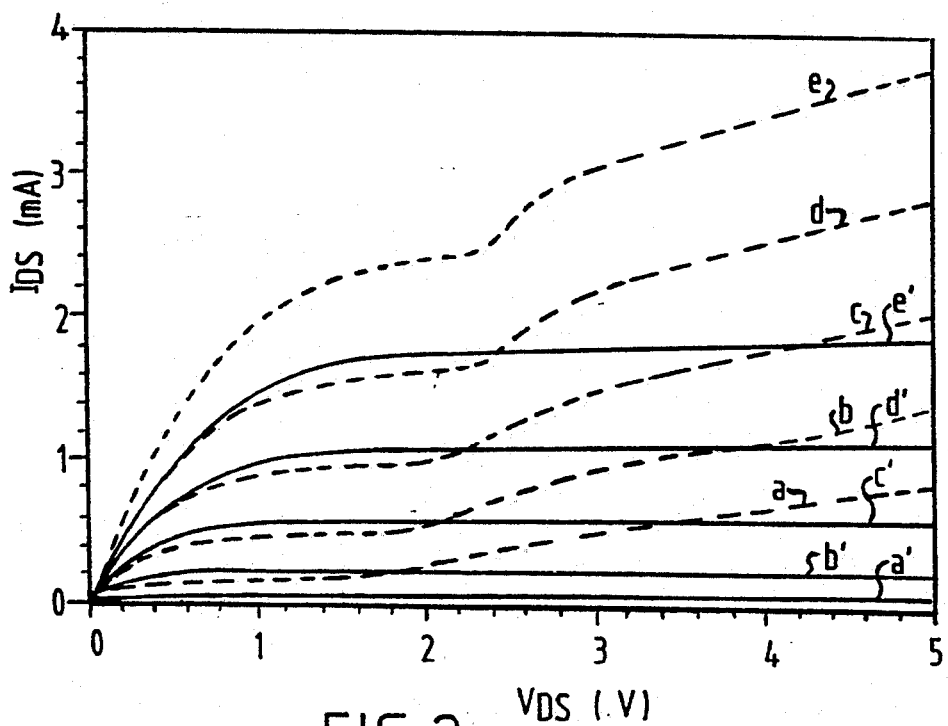
Figure 3:
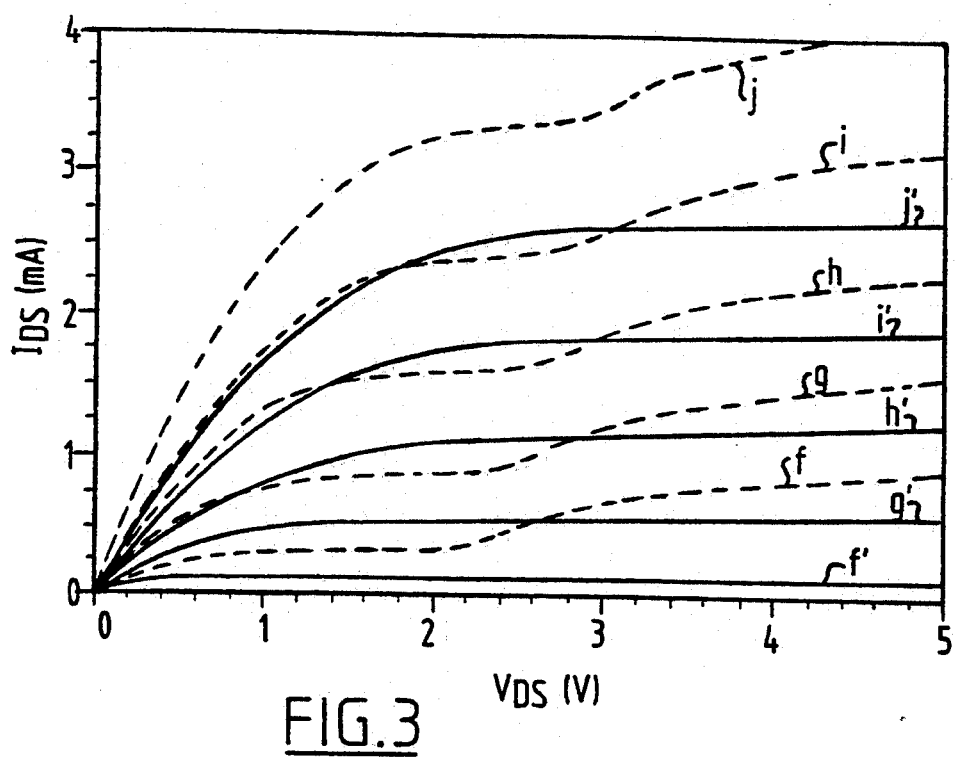
Figure 4:
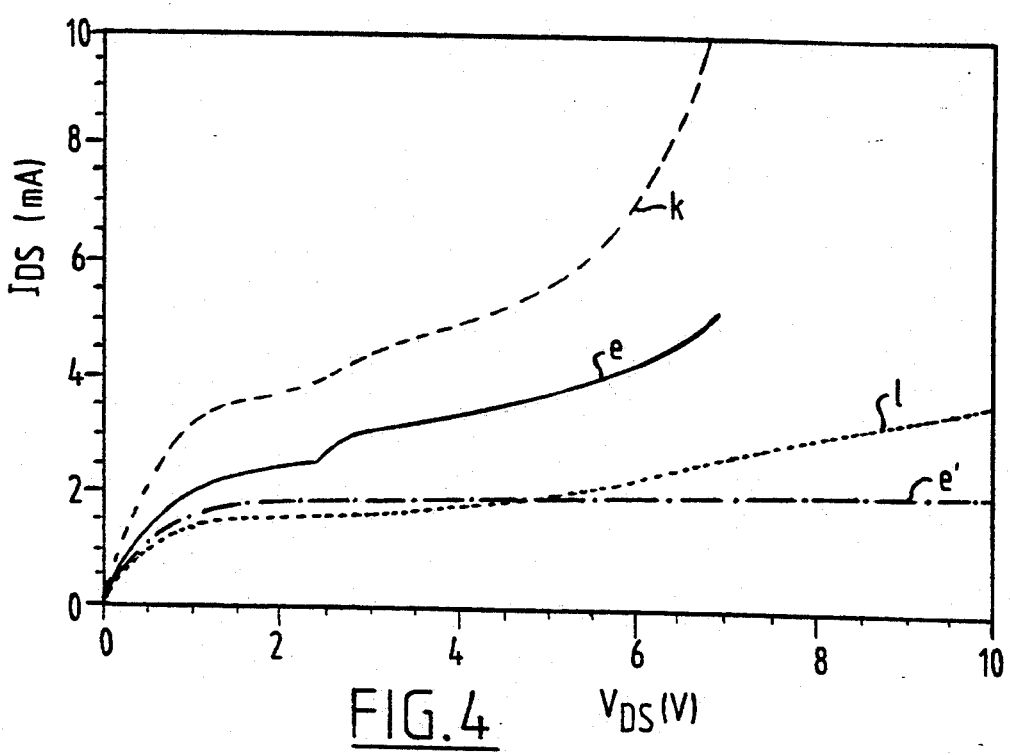

Further advantages, features and details of the present invention will become apparent in the light of the following description of a preferred embodiment with reference to a drawing, wherein:

FIG. 1 shows a schematic, sectional view of a preferred embodiment of a SOI-nMOS circuit element according to the present invention; and FIG. 2, 3 and 4 show graphs of measurements on a structure as depicted in FIG. 1.

A structure 1 (FIG. 1) comprises a schematically designated control electrode 16 for applying a voltage $V_{G2}$ behind a back oxide 2. This back oxide is preferably arranged using the SIMOX (Separation by Implantation of Oxygen) technique. SIMOX substrates or wafers are commercially available in standard form nowadays. Arranged on the back oxide 2 is an n+-source region 3 provided with a source terminal 4 for applying the source voltage $V_s$ (for example earth potential). Further arranged on the back oxide 2 are a first p-channel region 4, an n+-intermediate region 5 and a second p-channel region 6, wherein above the first channel region portion 4 and the second channel region portion 6 are arranged the respective oxide layers 7 and 8, wherein the respective electrodes 9 and 11 arranged above the oxide layer are commonly connected to a gate voltage $V_{GS}$. Using the voltage $V_{GS}$ n-channels are formed in the first and second channel region portions as indicated schematically with dashed lines 12 and 13 respectively. Further arranged on the back oxide 2 is a drain region 14 provided with a terminal 15 for applying a drain voltage $V_{DS}$.

The shown preferred embodiment is arranged in a SIMOX wafer with a silicon film thickness of 230 nm. First of all a 20 nm thick gate oxide is grown. Boron ions are subsequently implanted and a 400 nm thick polysilicon layer is then deposited to form the (doped) gate electrodes. Arsenic ions are implanted to form source and drain regions and the intermediate region 5. Source and drain are annealed and an oxide layer arranged to form contact holes wherein titanium tungsten (TiW) and aluminium silicon (AlSi) alloys are used to form the conductor paths.

In the graph of FIG. 2 (drain current ($I_{DS}$) as a function of the voltage between drain and source ($V_{DS}$)) the curves a, b, c, d, e are measured at room temperature (300 K) and at the value for the voltage $V_{VS}$ of 1.0 V (volt), 1.5 V; 2.0 V; 2.5 V; and 3.0 V respectively and a $V_{G2}$ of −10 V on a "normal" SOI-MOS transistor with a width-length ratio (W/L) of 50/2. It can clearly be seen that the Kink effect occurs in the curves in the region of $V_{DS}$ between 2.0 and 3.0 V. The curves a', b', c', d' represent curves measured with a structure of FIG. 2 at the same value for $V_{GS}$ wherein the width-length ratio of the first channel region portion 4 amounts to W/L=50/2 and that of the second channel region portion 50/1. It can be seen clearly that the Kink effect has been eliminated.

FIG. 3 is measured at the temperature of liquid helium (4.2 K). The broken lines f, g, h, i and j indicate the measured curves in the case of a SOI-MOS FET (W/L=50/2) at a gate source voltage $V_{GS}$ of respectively 1.5 V; 2.0 V; 2.5 V; 3.0 V and 3.5 V and a $V_{G2}$ of −10 V. The Kink effect is once again clearly observable. The full lines f', g', h', i', j' display no Kink effect and are measured on a structure as depicted in FIG. 1 wherein once again the width-length ratio of the first channel region portion amounts to 50/2 and that of the second channel region portion 50/1.

The curves shown in FIG. 4 were measured at room temperature (300 K), $V_{GS}$ 3.0 V, $V_{GT}$ −10 V. The full line e is likewise from FIG. 2, while the broken line k relates to a MOS-SOI transistor with W/L=50/1.

Line e' is already shown in FIG. 2, while line l is measured on the structure of FIG. 2, wherein source and drain are exchanged, that is, first a channel region portion with W/L=50/1 and behind this a channel region portion with W/L=50/2.

It is thought that the good results are obtained because the Kink effect at pinch-off is limited to the second channel region portion (indicated in FIG. 1 with an arrow and positive charge carriers) while the output characteristic is determined by the first channel region portion 4.

In order to verify the above a simulation was performed using ELDQ as described in B. Hennion, P. Senn: "ELDO: A New Third Generation Circuit Simulator using the On Step Relaxation Method", Proc. ISCAS, pp.1065–1068.

The results (not shown) of this simulation represent a sufficient verification of above stated theory of the operation of the circuit element according to the shown and described preferred embodiment of the present invention.

In order to elucidate the present invention a voltage $V_{G2}$ of −10 V was applied to the back gate; the present invention is however equally applicable at other values for $V_{G2}$, for instance $V_{G2}$=0.

We claim:

1. A circuit element comprising:
   a source region of a first conductance type, provided with a source terminal;
   an intermediate region of the first conductance type, separated from the source region by a first volume;
   a first channel region portion of a second conductance type opposed to the first conductance type, provided with a first gate terminal, and occupying the first volume;
   a drain region of the first conductance type provided with a drain terminal, and separated from the intermediate region by a second volume;
   a second channel region portion of the second conductance type provided with a second gate terminal conductively connected to the first gate terminal, and occupying said second volume; and an oxide layer having a first face, wherein the first channel region portion, the intermediate region, and the second channel region portion, are deposited on the first face of the oxide layer.

2. A circuit element as claimed in claim 1, wherein the second channel region portion has a channel length greater than that of the first channel region portion.

3. A circuit element as claimed in claim 1, wherein the width-to-length ration, W/L, of the first channel region portion is substantially equal to 50/2 and that of the second channel region portion is substantially equal to 50/1.

4. The circuit element of claim 1, wherein the oxide layer has a second face opposite the first face, and also including a control terminal connected to the second face of the oxide layer.

5. A circuit element as claimed in claim 1, wherein each of the first channel region portion and the second channel region portion comprises an n-channel.

6. The circuit element of claim 5, wherein the second channel region portion has a channel length greater than that of the first channel region portion.

* * * * *